United States Patent
Ishino et al.

(10) Patent No.: US 7,791,196 B2
(45) Date of Patent: Sep. 7, 2010

(54) SEMICONDUCTOR DEVICE HAVING A SMALLER ELECTROSTATIC CAPACITANCE ELECTRODE

(75) Inventors: Masakazu Ishino, Tokyo (JP); Hiroaki Ikeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 259 days.

(21) Appl. No.: 11/741,532

(22) Filed: Apr. 27, 2007

(65) Prior Publication Data
US 2007/0252273 A1  Nov. 1, 2007

(30) Foreign Application Priority Data
Apr. 27, 2006  (JP) .................. 2006-122913

(51) Int. Cl.
*H01L 23/48* (2006.01)
*H01L 21/44* (2006.01)

(52) U.S. Cl. ........... 257/737; 257/738; 257/E23.021; 257/E21.508; 438/612

(58) Field of Classification Search ............ 257/738, 257/737, E23.061, E21.508
See application file for complete search history.

(56) References Cited

U.S. PATENT DOCUMENTS

| 6,583,445 B1 * | 6/2003 | Reedy et al. ........... 257/82 |
| 6,586,323 B1 * | 7/2003 | Fan et al. ............. 438/614 |
| 6,784,557 B2 * | 8/2004 | Nakamura et al. ..... 257/784 |
| 2002/0004288 A1 * | 1/2002 | Nishiyama ........... 438/464 |

FOREIGN PATENT DOCUMENTS

| JP | 2004-079579 A | 3/2004 |
| JP | 2004-327910 A | 11/2004 |

* cited by examiner

*Primary Examiner*—Lex Malsawma
(74) *Attorney, Agent, or Firm*—Sughrue Mion, PLLC

(57) ABSTRACT

A semiconductor package includes a uniform thin insulating film covering the internal circuit formed on a silicon substrate. A plurality of thick island insulating films are formed underlying respective pad electrodes, which connect the internal circuit to an external circuit. The silicon substrate is polished from the bottom to have a thickness less than 0.6 mm. The thick island insulating films reduces an electrostatic capacitance of the pad electrodes to reduce the propagation delay of a signal passing through the pad electrodes.

14 Claims, 3 Drawing Sheets

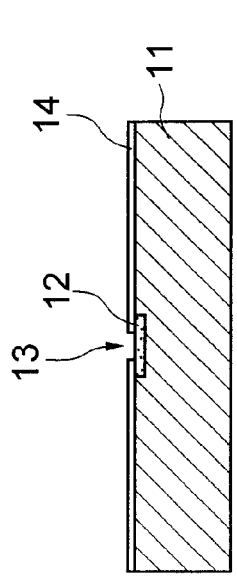
FIG. 2A
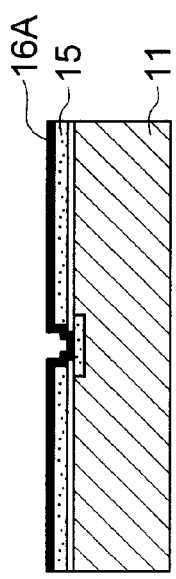
FIG. 2B
FIG. 2C
FIG. 2D
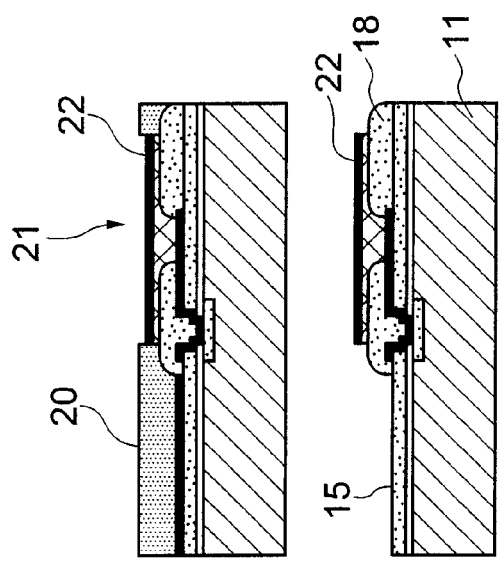
FIG. 2E
FIG. 2F

SEMICONDUCTOR DEVICE HAVING A SMALLER ELECTROSTATIC CAPACITANCE ELECTRODE

This application is based upon and claims the benefit of priority from Japanese patent application No. 2006-122913 filed on Apr. 27, 2006, the disclosure of which is incorporated herein in its entirety by reference.

BACKGROUND OF THE INVENTION

1. Field of the Invention

The present invention relates to a semiconductor device having a smaller electrostatic capacitance electrode and, more particularly, to an improvement of the structure of an electrode. The present invention also relates to a method for manufacturing such a semiconductor device.

2. Description of the Related Art

There is known a package structure in which an external electrode is directly formed on the surface of a semiconductor chip. Patent Publications JP-2004-79579A and JP-2004-327910A describe such a package structure. With reference to FIG. 4, the outline of the conventional package structure will be described. An array of pad electrodes 33 are formed on the surface of a silicon substrate 31 with an intervention of an insulating film 32, the pad electrodes 33 being connected to the internal electrodes of the internal circuit covered by the insulating film 32. An array of solder balls 34 are mounted on the respective pad electrodes 33, to form external electrodes for connecting to an external circuit such as a printed circuit board. This package structure 30 is known as a so-called wafer-level chip-size package.

To obtain the structure shown in FIG. 4, a semiconductor wafer manufactured by a typical semiconductor fabrication process is used. After the internal circuit, i.e., semiconductor circuit has been formed on the silicon substrate 31, the entire main surface of the semiconductor wafer is covered by the insulating film 32. Then, aluminum pads (not shown) to be connected to the external circuit are exposed by etching the insulating film 32 to form openings therethrough, followed by formation of interconnections 35 using Ti and Cu films in the openings and on the insulating film 32. Subsequently, the pad electrodes 33 and solder balls 34 are consecutively formed on the surface of the Ti/Cu interconnections 35, and thereafter the wafer is divided in to a plurality of chip-size packages. In such chip-size packages, i.e, wafer-level chip-side packages, formation of a plurality of packages can be achieved in block during the wafer stage of the packages. The wafer stage processing simplifies the structure of the packages and the fabrication process thereof, contributing to a reduction in both the package size and fabrication cost.

As described above, in the wafer-level chip-size semiconductor package having the conventional structure, the pad electrodes are formed on the silicon substrate with an intervention of an insulating film, and solder balls are mounted on the pad electrodes, to thereby establish the connection between the pad electrodes and board electrodes formed on a printed circuit board made of, for example, organic resin.

It is known that when such a connection structure is adopted, a stress occurs in the solder balls used for connection to the external circuit, due to a temperature change and a difference in the thermal expansion coefficient between the package, which is made of silicon, and the printed circuit board, which is made of organic resin. Occurrence of an excessive stress, if any, may lead to a disconnection in some cases between the pad electrodes and the external circuit.

As a countermeasure for the above-described problem, there may be considered to increase the diameter of the solder balls to thereby enhance the mechanical strength of the solder balls and the vicinity thereof. However, the use of solder balls having a larger diameter incurs another problem in that a larger electrostatic capacitance is associated between the silicon substrate and the pad electrodes. The larger electrostatic capacitance involves the disadvantage that the propagation delay of the signal increases.

Here, the electrostatic capacitance of the pad electrodes is exemplarily calculated. For the semiconductor package structure having the above configuration, the electrostatic capacitance of the pad electrodes, i.e., the capacitance between the pad electrodes and the silicon substrate is calculated for the case of a variety of the thicknesses of the insulating film.

It is assumed here that the diameter of the pad electrodes is 350 μm; and the dielectric constant $\epsilon$ of the insulating film is $3.5 \times 8.85 \times 10^{-12}$ F/m. The results of calculation are shown in Table 1.

TABLE 1

|  | Thickness (μm) | | | |
| --- | --- | --- | --- | --- |
|  | 5.0 | 10.0 | 20.0 | 30.0 |
| Capacitance (pF) | 0.596 | 0.298 | 0.149 | 0.099 |

The time length (td) required to charge a capacitor having a electrostatic capacitance of Cp=0.1 pF up to a terminal voltage of V=1 volt for the capacitor by using a charge current I of I=1 mA is calculated herein, by using the following equation:

$$td = Cp \times R = Cp \times V/I.$$

The time length td thus obtained may be considered to represent the propagation delay of the signal incurred by the electrostatic capacitance. The time length td calculated by the above equation is 0.1 ns, which corresponds to an operating frequency of about 10 GHz for the semiconductor device.

In other words, in order to transmit a high-speed signal having a frequency of 10 GHz or above and a signal current of 1 mA, the electrostatic capacitance of the pad electrodes should preferably be reduced down to 0.1 pF or less. As will be understood from the results shown in Table 1, the preferable thickness of the insulating film is about 30 μm or more in order to reduce the electrostatic capacitance of the pad electrodes down to 0.1 pF or less.

However, the thickness of the silicon substrate used in these days is reduced more and more in order to reduce the thickness of the entire package. For this purpose, the silicon wafer is typically polished after fabrication of the semiconductor circuit therein. If the thickness of the insulating film on the silicon wafer is relatively large, however, a smaller thickness of the polished silicon wafer may sometimes incur a warp of the silicon wafer due to the stress caused by the thick insulating film, making it difficult to perform subsequent processings for the semiconductor wafer.

Curvature radius "r" of a warp of the wafer can be represented by the following equation:

$$r = 2Eb/6(1-\nu)\sigma d \qquad (1),$$

where E, b, ν, d, σ are the Young's modulus of the substrate, thickness of the substrate, Poisson's Ratio of the substrate, thickness of the insulating film, and stress of the insulating film, respectively. Assuming that the wafer diameter is w, the warped amount "t" of the silicon wafer can be represented by the following equation:

$$t = r\{1 - \sin(\cos^{-1}(w/2r))\} \qquad (2)$$

If the film stress σ is 100 mega-Pascal (MPa), Young's modulus E of the substrate is 190 giga-Pascal (GPa), and Poisson's Ratio ν of the substrate is 0.07, the warped amount "t" of the wafer can be obtained for a variety of the thickness d of the insulating film, as shown in Table 2.

TABLE 2

| Film Thickness: d μm | Substrate Thickness: b μm | Curvature Radius: r mm | Wafer Diameter: w mm | Warped Amount: t mm |
|---|---|---|---|---|
| 5 | 0.6 | 24516 | 200 | 0.2 |
| 10 | 0.6 | 12258 | 200 | 0.4 |
| 20 | 0.6 | 6129 | 200 | 0.8 |
| 30 | 0.6 | 4086 | 200 | 1.2 |
| 5 | 0.1 | 681 | 200 | 7.4 |
| 10 | 0.1 | 341 | 200 | 15.0 |
| 20 | 0.1 | 170 | 200 | 32.5 |
| 30 | 0.1 | 114 | 200 | 59.8 |

As understood from Table 2, for the case where the wafer diameter w is 200 mm and substrate thickness b is 0.6 mm, the warped amount t is as small as 1.2 mm even if the thickness d of the insulating film is 30 μm, which incurs substantially no problem. On the other hand, if the substrate thickness b, which is the wafer thickness, is reduced down to 0.1 mm, the warped amount t is as large as about 60 mm and, therefore, a problem occurs in the transportation of the wafer or an exposure step in a photolithographic process, for example.

SUMMARY OF THE INVENTION

An object of the present invention is to provide a semiconductor device including a pad electrode having a reduced electrostatic capacitance with respect to a silicon substrate, without incurring a larger warped amount of the silicon substrate, thereby achieving smooth handling of the wafer in a semiconductor fabrication process.

The present invention provides, in a first aspect thereof, a semiconductor device including: a substrate; an electric circuit formed on the substrate; an insulating film covering the electric circuit; and a pad electrode formed on the insulating film to connect the electric circuit to an external circuit, wherein the insulating film has a thickness larger at a portion underlying the pad electrode than at another portion of the insulating film.

The present invention provides, in a second aspect thereof, a method for manufacturing a semiconductor device including: forming an internal electrode on a substrate; forming a first insulating film on the substrate, the first insulating film having a first opening exposing therethrough the internal electrode; forming an interconnection having a first portion extending on the internal electrode within the first opening and a second portion extending from the first portion on the insulating film; forming an island insulating film on the interconnection and the first insulating film, the island insulating film having a second opening exposing therethrough the second portion of the interconnection; and forming pad electrode on the island insulating film, the pad electrode being connected to the second portion of the interconnection through the second opening.

The above and other objects, features and advantages of the present invention will be more apparent from the following description, referring to the accompanying drawings.

BRIEF DESCRIPTION OF THE DRAWINGS

FIGS. 2A to 2F are sectional views of the semiconductor device of FIG. 1, consecutively showing the steps of fabrication process thereof;

DETAILED DESCRIPTION OF THE PREFERRED EMBODIMENTS

Now, an exemplary embodiment of the present invention will be described with reference to accompanying drawings.

Figure 1:
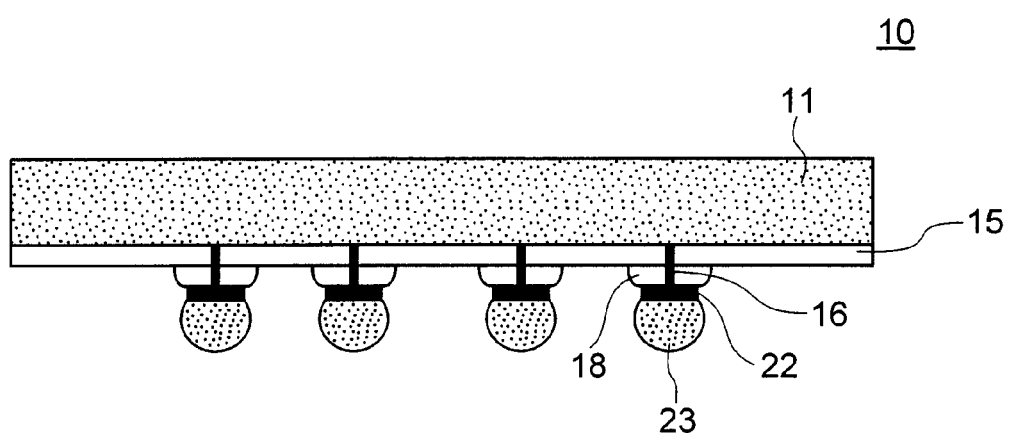
FIG. 1 is a sectional view of a semiconductor device according to an embodiment of the present invention.

FIG. 1 is a sectional view of a semiconductor device according to an embodiment of the present invention. FIG. 1 shows the state of the semiconductor device, generally designated by numeral 10, where the external electrodes each including a pad electrode 22 and a solder ball 23 have been formed on the surface of a wafer-level chip-size semiconductor package of the semiconductor device.

On the entire surface of the silicon substrate 11, on which an internal electric circuit, i.e., semiconductor circuit has been formed, a uniform thin insulating film 15 having an array of through-holes therein is formed, and an array of thick island insulating films 18 are disposed on the thin insulating film 15 corresponding to the through-holes. The pad electrodes 22 are formed on the island insulating film 18, and solder balls 23 are mounted on top of the pad electrodes 22. The pad electrodes 22 are electrically connected to the internal circuit formed in the silicon chip via interconnections and/or via-plugs penetrating the thin insulating film 15 and thick insulating films 18. The island insulating films 18 having therein an opening have a shape of torus.

In the configuration as described above, the thick island insulating films 18 and the thin insulating film 15 are sandwiched between the pad electrodes 22 and the silicon substrate 11, whereby the electrostatic capacitance formed between the pad electrodes 22 and the silicon substrate 11 can be reduced. On the other hand, since the thick island insulating films 18 are formed only on the portion of the thin insulating film 15 corresponding to the pad electrodes 22, the stress generated by the thick insulating film 18 is applied to only the local region of the silicon substrate 11. Therefore, even if the thickness of the silicon substrate 11 is as small as less than 0.6 mm, the warped amount of the silicon substrate 11 can be reduced to a desired level.

In the semiconductor device having the package structure according to the present embodiment, the smaller warped amount of the silicon substrate 11 allows the silicon wafer to be polished by, for example, a chemical-mechanical polishing (CMP) processing without a trouble. Further, the reduction in the electrostatic capacitance between the pad electrodes 22 and the silicon substrate 11 reduces the propagation delay of the signal passing through the pad electrodes 22, which is desirable especially in a high-speed semiconductor device.

Next, with reference to FIGS. 2A to 2F, a process for manufacturing the semiconductor device according to the above embodiment will be described. FIG. 2A shows a sectional view of a portion of a semiconductor wafer obtained using a typical fabrication process of a semiconductor device (or LSI). In FIG. 2A as well as FIGS. 2B to 2F, the internal circuit of the semiconductor device is not specifically illustrated for a simplification purpose. Aluminum (Al) electrodes 12 each configuring an internal electrode of the internal circuit are formed on the surface of the semiconductor wafer (substrate) 11. On the Al electrodes 12, a silicon nitride (SiN) film 14 is formed having a plurality of openings 13 each located on the central portion of one of the Al electrodes 12. The SiN film 14 serves as a protection film for protecting the internal circuit of the semiconductor package.

Subsequent to the step shown in FIG. 2A, a photosensitive polyimide film 15 is coated on the surface of the semiconductor wafer (substrate) 11 to a thickness of less than 5 µm. Subsequently, the photosensitive polyimide film 15 is exposed to light and developed to form therein a plurality of openings on the respective Al electrodes 12. Thereafter, a titanium (Ti) layer is formed as barrier layer by spattering to a thickness of 0.01 µm, and a copper (Cu) layer is formed as an interconnection layer by spattering to a thickness of 2 µm (FIG. 2B). In FIG. 2B, the Ti and Cu layers are shown as a single Ti/Cu thin film 16A. Subsequently, a photoresist film is formed by coating onto the surface of the Ti/Cu film 16A, exposed to light and developed, thereby forming a resist mask 17 having an interconnection pattern. Thereafter, wet etching is performed to pattern the Ti/Cu thin film 16A, to form Ti/Cu interconnections 16 on the Al electrodes 12 and insulating film 15 (FIG. 2C).

After removing the resist mask 17 remaining on the surface, a photosensitive polyimide film is formed by coating onto the entire surface including the surface of the Ti/Cu interconnections 16 to a thickness of 25 µm, exposed to light and developed, thereby leaving a plurality of polyimide films 18 having a torus shape. Subsequently, Ti and Cu layers are formed by spattering to a thicknesses of 0.01 µm and 0.05 µm, respectively, to form a Ti/Cu plating seed film 19 (FIG. 2D). Subsequently, a resist film 20 is formed thereon by coating, exposed to light and developed, to thereby form circular openings 21 exposing therethrough the torus polyimide films 18 except for the periphery thereof. Thereafter, Cu, Ni, and Au are consecutively deposited by electroplating onto the inner side of the openings 21 to thicknesses of 5 µm, 2 µm, and 0.05 µm, respectively, to form a Cu/Ni/Au plated layer 22 (FIG. 2E).

Figure 3:
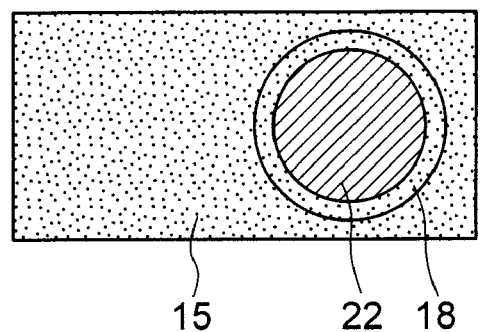
FIG. 3 is a top plan view of the semiconductor device of FIG. 1 at the step shown in FIG. 2F.
Figure 4:
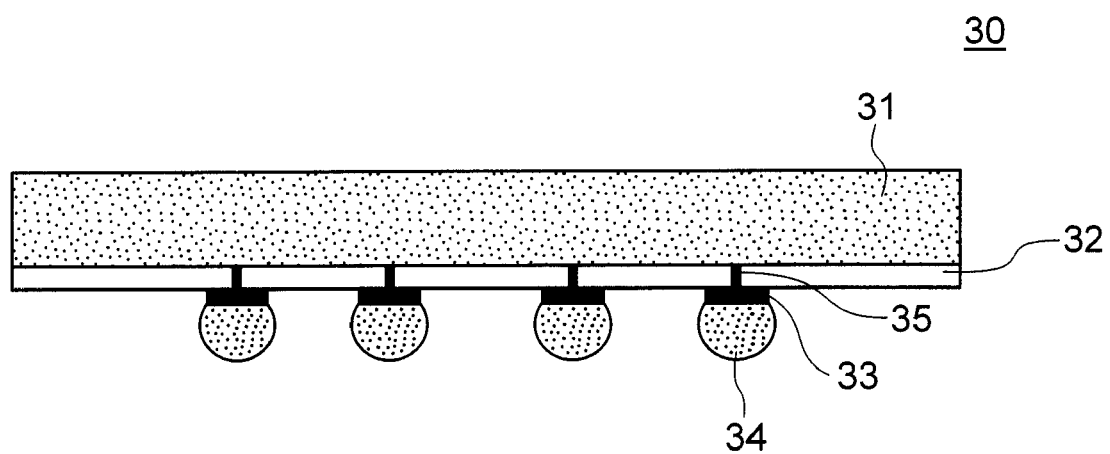
FIG. 4 is a sectional view of a conventional semiconductor package.

Subsequently, the resist film 20 is removed, and the exposed portion of the seed film 19 is removed. FIG. 2F and FIG. 3 show the sectional structure and the planar structure of the semiconductor device in the state after the resist film 20 and the Ti/Cu thin film 19 serving as a seed film has been removed by etching, from the wafer shown in the step of FIG. 2E. In FIG. 2F and FIG. 3, the Cu/Ni/Au plated layer 22 configures the pad electrodes, the SiN film 14 and polyimide film 15 configure the thin insulating film, and torus-shaped island polyimide films 18 configure the thick insulating films.

By using the above fabrication process, the thin polyimide insulating film 15 and thick polyimide insulating films 18 are formed on the surface of the silicon wafer, wherein the pad electrodes 22 are formed only on the position where the thick insulating films 18 are formed. Thereafter, by mounting the solder balls 23 on the respective pad electrodes 22, the package structure shown in FIG. 1 is obtained.

The pad electrodes 22 are electrically connected to the semiconductor circuit formed within the silicon chip, by way of the Ti/Cu interconnections 16 and Al electrodes 12. In the present embodiment, the photosensitive polyimide is used to form the thick insulating films 18. Thus, by providing a larger thickness for the portion of the insulating layer immediately underlying the pad electrodes 22 while providing a smaller thickness for the remaining portion of the insulating layer, it is possible to reduce the electrostatic capacitance between the pad electrodes 22 and the silicon substrate 11, without incurring a larger stress on the silicon substrate. As a result, a high-speed operation semiconductor device can be obtained.

According to the configuration of the above embodiment, the thin insulating film 15 having a thickness of 5 µm is formed on the semiconductor wafer (substrate) 11, and the thick insulating film 18 having a thickness of 30 µm is formed immediately under the pad electrodes 22, whereby the stress of the insulating film in the entire chip substantially corresponds to the stress of an insulating layer having a thickness of 5 µm. Thus, even if the wafer is polished to have a thickness of 0.6 mm or smaller, it will be not subjected to an undesirable warp. On the other hand, the thick insulating films 18 having a thickness of 30 µm are formed on the position immediately underlying the pad electrodes 22. This reduces the electrostatic capacitance between the pad electrodes 22 and the silicon substrate 11, thereby allowing a high-speed signal to be transmitted via the pad electrodes.

Thus, it is possible to provide pad electrodes having a smaller electrostatic capacitance and a larger diameter directly on the thin silicon chip, thereby achieving a semiconductor wafer-level chip-size package having a higher connection reliability and a smaller thickness which area suitable for a high frequency device.

As described above, in the semiconductor device of the above embodiment and the semiconductor device manufactured by the method of the above embodiment, the island insulating films underlying the pad electrodes provide a smaller electrostatic capacitance for the pad electrodes, whereby the propagation delay of a signal passing through the pad electrodes can be reduced. The other portion of the first insulating film on which the island insulating films are not formed reduces a warped amount of the silicon substrate caused by the inner stress of the insulating film, thereby providing an easy handing of the wafer during the fabrication process. Formation of the island insulating film may be replaced by forming a thick portion of the first insulating film at the location where the pad electrodes are to be formed.

The present invention is applicable to a wafer-level chip-size package (WCSP) as well as an interposer substrate having a structure in which pad electrodes are directly provided on the silicon substrate which is used for configuring a System in Package (SiP). Further, the present invention is applicable to a semiconductor substrate such as a silicon substrate as well as to a metal substrate, insulating substrate, or semi-insulating substrate.

While the present invention has been particularly shown and described with reference to exemplary embodiments thereof, the present invention is not limited to these embodiments. It will be understood by those of ordinary skill in the art that various changes in form and details be made therein without departing from the spirit and scope of the present invention as defined in the claims.

What is claimed is:

1. A semiconductor device comprising:
   a substrate;
   an electric circuit having a circuit electrode formed on said substrate;
   a first insulating film covering said electric circuit and having a first opening exposing a part of said circuit electrode;
   a conductive member formed in contact with the part of said circuit electrode through the first opening, said conductive member being elongated over the first insulating film to form an elongated portion;

a second insulating film covering the elongated portion of said conductive member, said second insulating film being smaller in area than said first insulating film to leave a portion of said first insulating film uncovered by said second insulating film and having a second opening to expose a part of the elongated portion of said conductive member; and a pad electrode formed in contact with the part of the elongated portion of said conductive member through the second opening and elongated over said second insulating film, wherein said second insulating film is in an island form generally surrounded by said portion of said first insulating film that is uncovered by said second insulating film.

2. The semiconductor device according to claim 1, wherein said substrate includes silicon and has a thickness of less than 0.6 mm.

3. The semiconductor device according to claim 2, wherein said second insulating film has a thickness of larger than 5 μm and said first insulating film has a thickness of 5 μm or smaller.

4. The semiconductor device according to claim 1, wherein an electrostatic capacitance between said pad electrode and said substrate is 0.1 pico-farad or smaller.

5. The semiconductor device according to claim 1, wherein said substrate includes a metal.

6. The semiconductor device according to claim 1, wherein said first insulating film having a uniform thickness, and said second insulating film formed on said first insulating film and underlying said pad electrode;

wherein the second insulating film is in an island form.

7. The semiconductor device according to claim 6, wherein said second insulating film has therein the second opening through which said pad electrode is connected to said electric circuit.

8. The semiconductor device according to claim 6, wherein said first insulating film has a thickness of 5 μm or smaller and said second insulating film has a thickness larger than 5 μm.

9. A method for manufacturing a semiconductor device comprising:

forming an electric circuit having a circuit electrode on a substrate;

forming a first insulating film on said substrate so as to cover said electric circuit, said first insulating film having a first opening exposing a part of said circuit electrode;

forming a conductive member in contact with the part of said circuit electrode through the first opening, said conductive member being elongated over the first insulating film to form an elongated portion;

forming a second insulating film covering the elongated portion of said conductive member, said second insulating film being smaller in area than said first insulating film to leave a portion of said first insulating film uncovered by said second insulating film and having a second opening to expose a part of the elongated portion of said conductive member; and forming a pad electrode in contact with the part of the elongated portion of said conductive member through the second opening and elongated over said second insulating film, wherein said second insulating film is in an island form generally surrounded by said portion of said first insulating film that is uncovered by said second insulating film.

10. The method according to claim 9, wherein said forming of pad electrode comprises forming a metal seed film on said island insulating film and said second portion, and selectively forming a plating layer on said metal seed film.

11. A semiconductor wafer having a plurality of semiconductor devices formed thereon, comprising:

a substrate;

an electric circuit formed on said substrate;

insulation contacting and covering said electric circuit; and a pad electrode formed on and contacting said insulation to connect said electric circuit to an external circuit, wherein said insulation underlying said pad electrode forms an island having a thickness larger than said insulation between adjacent pad electrodes; and wherein said thickness of said insulation underlying said pad electrode is larger than 10 μm and said thickness of said portion of said insulation which does not underlie said pad electrode is 5 μm or smaller.

12. A semiconductor device comprising:

a substrate;

an electric circuit formed on said substrate;

insulation contacting and covering said electric circuit; and a pad electrode formed on and contacting said insulation to connect said electric circuit to an external circuit, wherein said insulation underlying said pad electrode forms an island having a thickness larger than said insulation between adjacent pad electrodes; and wherein said pad electrode is connected to said electric circuit via a conductive member and an electrode of said electric circuit.

13. The semiconductor device according to claim 12, wherein said conductive member extends away from said electrode of said electric circuit so that a portion of said conductive layer is not provided directly above said electrode of said electric circuit.

14. A semiconductor device comprising:

a substrate;

an electric circuit formed on said substrate;

insulation contacting and covering said electric circuit; and a pad electrode formed on and contacting said insulation to connect said electric circuit to an external circuit, wherein said insulation underlying said pad electrode forms an island having a thickness larger than said insulation between adjacent pad electrodes; and wherein said insulation underlying said pad electrode is provided between an electrode of said electric circuit and said pad electrode.

* * * * *

UNITED STATES PATENT AND TRADEMARK OFFICE
CERTIFICATE OF CORRECTION

PATENT NO. : 7,791,196 B2
APPLICATION NO. : 11/741532
DATED : September 7, 2010
INVENTOR(S) : Masakazu Ishino and Hiroaki Ikeda It is certified that error appears in the above-identified patent and that said Letters Patent is hereby corrected as shown below:

In The Specifications:

Column 2, Line 32: delete "1=1" and insert -- I=1 --, therefor.

Column 3, Line 16: delete "b μm" and insert -- b mm --, therefor.

Signed and Sealed this

Fourteenth Day of December, 2010

David J. Kappos
*Director of the United States Patent and Trademark Office*